US008860413B2

(12) United States Patent
Hopper et al.

(10) Patent No.: US 8,860,413 B2
(45) Date of Patent: Oct. 14, 2014

(54) NUCLEAR MAGNETIC RESONANCE TOOL WITH MOVABLE MAGNETS

(75) Inventors: Tim Hopper, Shenton Park (AU); Luis E. Depavia, Sugar Land, TX (US); Yi-Qiao Song, Newton, MA (US); David T. Oliver, Sugar Land, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 351 days.

(21) Appl. No.: 13/288,508

(22) Filed: Nov. 3, 2011

(65) Prior Publication Data

US 2012/0126809 A1      May 24, 2012

Related U.S. Application Data

(60) Provisional application No. 61/418,172, filed on Nov. 30, 2010, provisional application No. 61/415,407, filed on Nov. 19, 2010, provisional application No. 61/488,265, filed on May 20, 2011.

(51) Int. Cl.
*G01V 3/00*      (2006.01)
*G01R 33/38*     (2006.01)
*G01V 3/32*      (2006.01)

(52) U.S. Cl.
CPC .............. *G01V 3/32* (2013.01); *G01R 33/3808* (2013.01)
USPC .......................................................... 324/303

(58) Field of Classification Search
USPC ................................................... 324/300–322
See application file for complete search history.

(56) References Cited

U.S. PATENT DOCUMENTS

| 6,268,726 | B1 * | 7/2001 | Prammer et al. | 324/303 |
| 6,362,619 | B2 * | 3/2002 | Prammer et al. | 324/303 |
| 6,392,410 | B2   | 5/2002 | Luong et al. | |
| 6,400,149 | B1   | 6/2002 | Luong et al. | |
| 6,583,621 | B2 * | 6/2003 | Prammer et al. | 324/303 |
| 6,825,659 | B2 * | 11/2004 | Prammer et al. | 324/303 |
| 2010/0244828 | A1 | 9/2010 | Pines et al. | |

* cited by examiner

*Primary Examiner* — Dixomara Vargas
(74) *Attorney, Agent, or Firm* — Kimberly Ballew

(57) ABSTRACT

Methods and systems are provided that enable logging while drilling NMR measurements to be made with a tool having magnets with positions adjustable or movable relative to each other. Such movement can affect the depth of investigation of the NMR tool. A variety of moving assemblies can be used to effectuate the movement, which can be performed either at the surface or downhole. The tool also can include a magnetically permeable member to control the magnetic field gradient.

15 Claims, 12 Drawing Sheets

NUCLEAR MAGNETIC RESONANCE TOOL WITH MOVABLE MAGNETS

CROSS-REFERENCE TO RELATED APPLICATIONS

This application claims priority to U.S. Provisional Patent Application No. 61/415,407, titled "NUCLEAR MAGNETIC RESONANCE TOOL WITH EXTERNAL MAGNETS," filed on Nov. 19, 2010; No. 61/418,172, titled "NUCLEAR MAGNETIC RESONANCE TOOL WITH MOVABLE MAGNETS," filed on Nov. 30, 2010; and No. 61/488,265, titled "NUCLEAR MAGNETIC RESONANCE TOOL WITH EXTERNAL MAGNETS," filed on May 20, 2011, the entire disclosures of which are hereby incorporated by reference herein.

STATEMENT REGARDING FEDERALLY SPONSORED RESEARCH OR DEVELOPMENT

Not applicable.

BACKGROUND OF THE INVENTION

1. Field of the Invention

The invention relates generally to the field of nuclear magnetic resonance tools. More specifically, the invention relates to nuclear magnetic resonance tools having magnets that are movable so as to control the depth of investigation for the tools.

2. Background Art

Nuclear magnetic resonance (NMR) can be used to determine various characteristics of subsurface formations and/or samples. NMR logging tools can be used downhole to obtain these characteristics, which then can be used to assist in the determination of, for example, the presence, absence, and/or location of hydrocarbons in a given formation or sample.

Conventional NMR logging, well known in the art, generally involves deploying in a wellbore an NMR instrument, which uses magnetic fields to generate and detect various RF signals from nuclei in a formation or sample. Certain example NMR techniques are described in U.S. Pat. No. 6,232,778 assigned to Schlumberger Technology Corp., the entire disclosure of which is hereby incorporated by reference.

More specifically, NMR involves the perturbation of spins systems with a Radio Frequency (RF) field in the presence of a polarizing static magnetic field, Bo. The frequency of operation is defined in terms of the Larmor Frequency ($\omega\_0$) where $\omega\_0 = \gamma B\_0$. The Bo field is defined by the magnet geometry and typically is fixed in place. A RF pulse, B1, is then applied to perturb the spin system by applying energy at the resonant condition and orthogonal to Bo. The oscillating signal is then received by the same, or different, coil and the NMR properties of the sample can be calculated.

Logging While Drilling NMR typically uses only one frequency of operation. This frequency corresponds to a depth of investigation inside the formation. Various wireline NMR tools have shown that being able to acquire data at multiple depths enables an accurate measurement of the invasion of drilling fluids into the formation. Additionally, conventional logging-while-drilling (LWD) NMR tools include permanent magnets that are generally mounted in a relatively fixed position that does not allow for movement.

Because of the limitations of conventional LWD NMR systems, it is extremely difficult to acquire data at multiple depths of investigation. Accordingly, there is a need in the art for methods and systems for obtaining NMR measurements that overcome one or more of the deficiencies that exist with conventional methods.

SUMMARY OF THE INVENTION

In one aspect, a nuclear magnetic resonance apparatus is provided. The apparatus can include a first magnet embedded in the drill collar, a second magnet having a spacing from the first magnet, and a moving assembly for controlling the spacing between the second magnet and first magnet.

In another aspect, a method for logging a formation is provided. The method can include placing a nuclear magnetic resonance tool in a borehole in the formation, the nuclear magnetic resonance tool comprising a first magnet movable with respect to a second magnet, the first magnet and the second magnet being separated by a first spacing, and obtaining a first nuclear magnetic resonance measurement from the nuclear magnetic resonance tool while the first magnet and second magnet are separated by the first spacing.

In another aspect, moving the permanent magnets used in an NMR apparatus in order to change the magnetic field characteristics is disclosed. In the case of an oilfield formation evaluation tool, this can be done prior to putting the tool downhole or achieved during the course of the downhole logging job. These changes may be achieved through the use of mechanical actuators to move the magnet positions relative to each other or other structural (or soft magnetic) elements so as to change the static magnetic field strength. The magnet position could be changed prior to use in the case of fixed positions, or it could be changed during logging with a control line to a mechanical actuator.

In another aspect, the use of a mechanical actuator to change the structure of a magnetically permeable material placed around the permanent magnets is disclosed. By changing the shape and position of such permeable material pieces, changing the static magnetic field and subsequently magnetic field gradient is enabled. The shaping of the magnetic field by use of a series of permeable rings is another aspect.

Other aspects and advantages of the invention will be apparent from the following description and the appended claims.

DETAILED DESCRIPTION

The invention provides systems and methods that enable NMR measurements to be made with magnets that can be moved, thereby affecting the depth of investigation of the NMR tool. Various example methods and systems will now be described with reference to FIGS. 1-12, which depict representative or illustrative embodiments of the invention.

Figure 1:
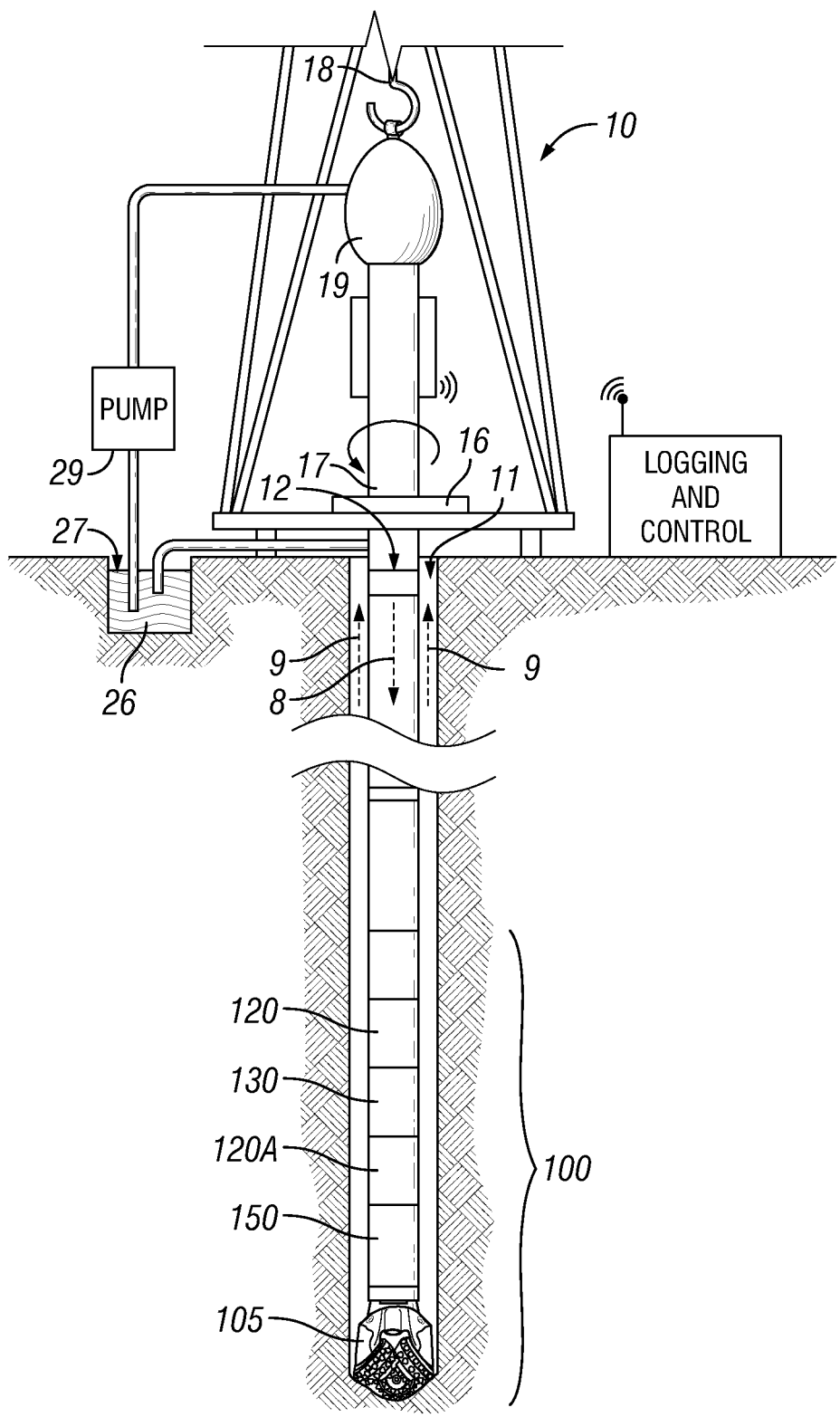
FIG. 1 illustrates a wellsite system in which the present invention can be employed, according to an example embodiment.

FIG. 1 illustrates a wellsite system in which the present invention can be employed, according to an example embodiment. The wellsite can be onshore or offshore. In this example system, a borehole 11 is formed in subsurface formations 106 by rotary drilling in a manner that is well known. Embodiments of the invention can also use directional drilling, as will be described hereinafter.

A drill string 12 is suspended within the borehole 11 and has a bottom hole assembly 100 which includes a drill bit 105 at its lower end. The surface system includes platform and derrick assembly 10 positioned over the borehole 11, the assembly 10 including a rotary table 16, kelly 17, hook 18 and rotary swivel 19. The drill string 12 is rotated by the rotary table 16, energized by means not shown, which engages the kelly 17 at the upper end of the drill string. The drill string 12 is suspended from a hook 18, attached to a travelling block (also not shown), through the kelly 17 and a rotary swivel 19 which permits rotation of the drill string relative to the hook. As is well known, a top drive system could alternatively be used.

In the example of this embodiment, the surface system further includes drilling fluid or mud 26 stored in a pit 27 formed at the well site. A pump 29 delivers the drilling fluid 26 to the interior of the drill string 12 via a port in the swivel 19, causing the drilling fluid to flow downwardly through the drill string 12 as indicated by the directional arrow 8. The drilling fluid exits the drill string 12 via ports in the drill bit 105, and then circulates upwardly through the annulus region between the outside of the drill string and the wall of the borehole 11, as indicated by the directional arrows 9. In this well known manner, the drilling fluid lubricates the drill bit 105 and carries formation 106 cuttings up to the surface as it is returned to the pit 27 for recirculation.

In various embodiments, the systems and methods disclosed herein can be used with any means of conveyance known to those of ordinary skill in the art. For example, the systems and methods disclosed herein can be used with an NMR tool conveyed by wireline, slickline, drill pipe conveyance, coiled tubing drilling, and/or a while-drilling conveyance interface. For the purpose of an example only, FIG. 1 depicts a while-drilling interface. However, systems and methods disclosed herein could apply equally to wireline or any other suitable conveyance means. The bottom hole assembly 100 of the illustrated embodiment includes a logging-while-drilling (LWD) module 120, a measuring-while-drilling (MWD) module 130, a roto-steerable system and motor, and drill bit 105.

The LWD module 120 is housed in a special type of drill collar, as is known in the art, and can contain one or a plurality of known types of logging tools. It will also be understood that more than one LWD and/or MWD module can be employed, e.g. as represented at 120A. (References, throughout, to a module at the position of 120 can alternatively mean a module at the position of 120A as well.) The LWD module includes capabilities for measuring, processing, and storing information, as well as for communicating with the surface equipment. In the present embodiment, the LWD module includes a nuclear magnetic resonance measuring device.

The MWD module 130 is also housed in a special type of drill collar, as is known in the art, and can contain one or more devices for measuring characteristics of the drill string and drill bit. The MWD tool further includes an apparatus (not shown) for generating electrical power to the downhole system. This may typically include a mud turbine generator powered by the flow of the drilling fluid, it being understood that other power and/or battery systems may be employed. In the present embodiment, the MWD module includes one or more of the following types of measuring devices: a weight-on-bit measuring device, a torque measuring device, a vibration measuring device, a shock measuring device, a stick slip measuring device, a direction measuring device, and an inclination measuring device.

Figure 2:
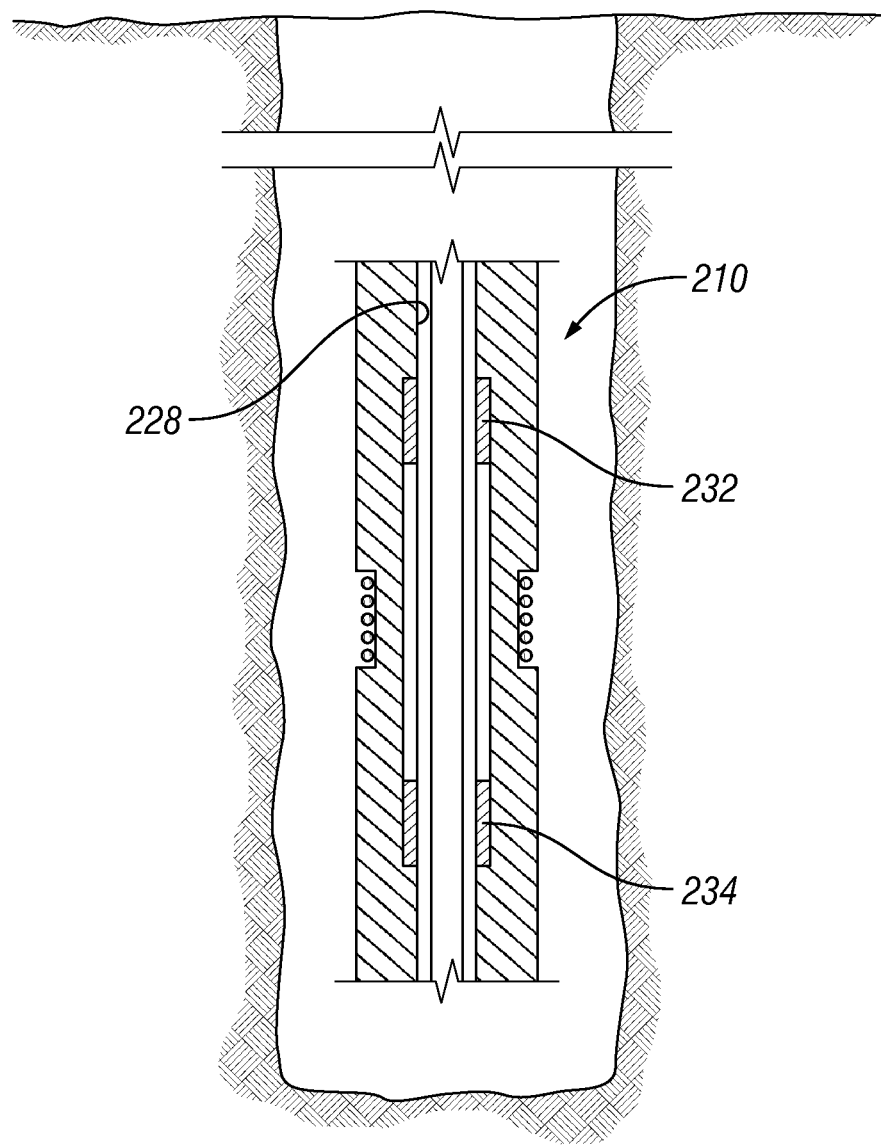
FIG. 2 shows an embodiment of a type of device for formation evaluation while drilling using NMR, according to an example embodiment.

FIG. 2 shows an embodiment of a type of device for formation evaluation while drilling using NMR, it being understood that other types of NMR/LWD tools can also be utilized as the LWD tool 120 or part of an LWD tool suite 120A. Referring to FIG. 2, in an example embodiment of the invention, hereinafter referred to as a low gradient design, magnet array comprises an upper magnet 232 axially separated from a lower magnet 234. The area between magnets 232, 234 is suitable for housing elements such as electronic components, an RF antenna, and other similar items. Both magnets 232, 234 surround sleeve 228.

The magnets 232, 234 can be polarized in a direction parallel to the longitudinal axis of the tool 210 with like magnetic poles facing each other. For each magnet 232, 234, the magnetic lines of induction travel outward from an end of the magnet 232, 234 into the formation to create a static field parallel to the axis of the tool 210 and travel inward to the other end of the magnet 232, 234. In the region between upper magnet 232 and lower magnet 234, the magnetic lines of induction travel from the center outward into the formation, creating a static field in the direction perpendicular to the axis of the tool 210. The magnetic lines of induction then travel inward symmetrically above the upper magnet 232 and below the lower magnet 234 and converge in the longitudinal direction inside sleeve 228.

Figure 3:
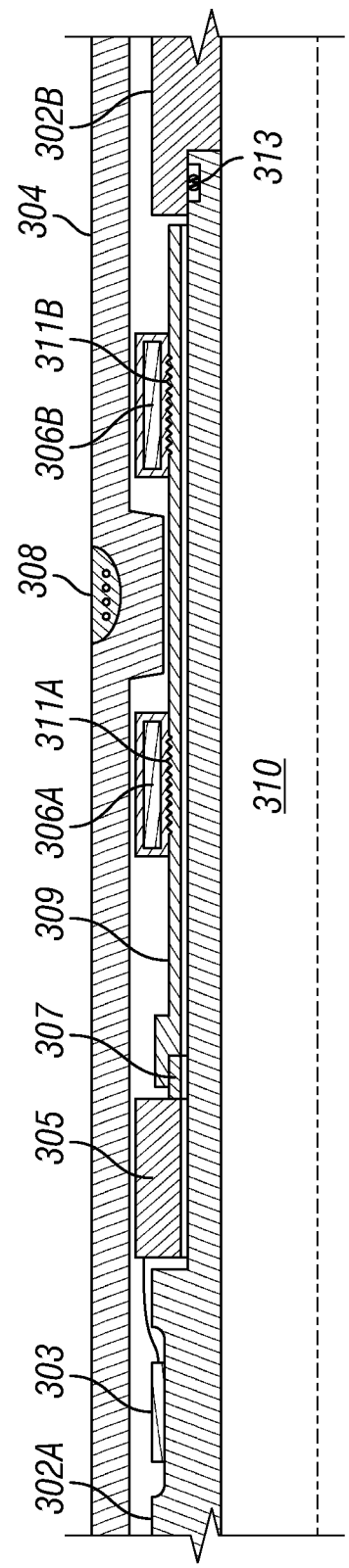
FIG. 3 is a schematic diagram illustrating movable magnets on an NMR assembly, according to an example embodiment.

FIG. 3 is a schematic diagram illustrating movable magnets 306A, B on an NMR assembly, according to an example embodiment. As shown in FIG. 3, the NMR assembly can include a drill collar 304, and a variety of components disposed therein. For example, the drill collar 304 can include connections to an upper chassis 302A and lower chassis 302B, with the electronics 303 for the NMR assembling being disposed proximate the upper chassis 302A. Additionally, the drill collar 304 can include two magnets 306A, B with an antenna 308 disposed therebetween. Although the magnets 306A, B shown in FIG. 3 are disposed within the drill collar 304, the magnets 306A, B can be placed on the outside of the collar 304 in some embodiments. As may be recognized by one of ordinary skill in the art having benefit of the present disclosure, other suitable arrangements and configurations of the components of the NMR assembly are possible.

The example assembly shown in FIG. 3 can further include mechanisms for moving and/or adjusting the magnets 306A, B and/or the spacing therebetween. For example, as shown in FIG. 3, the magnets 306A, B can be arranged in the collar 304 such that they are placed symmetrically about the antenna 308. The drive screw 309 can interface with or otherwise engage with a first magnet 306A having right hand threads 311A and with a second magnet 306B having left hand threads 311B. Rotation of the drive screw 309 by an annular motor 305 and motor output shaft 307 connected to the drive screw 309 can move the magnets 306A, B in opposite directions to either increase or decrease the magnet spacing. The annular motor 305 can be controlled by electronics 303 located on the upper chassis 302A. The electronics 303 can include those components necessary to interface with the antenna 308 for NMR functions and the rest of the tool for control, data management and telemetry. The upper chassis 302A can meet the lower chassis 302B with a seal 313, providing a mud flow channel 310 through the inside of the chassis 302A, 302B.

A similar mechanical set up can be designed to move each magnet 306A, B independently. In some embodiments, the mechanics can be used to preset the magnet positions before the tool is deployed downhole or to set and reset the magnet positions during the logging operation.

This arrangement is beneficial in that it increases the likelihood that the magnets 306A, B are always located approximately equal distances from the antenna 308, minimizes wiring complexity, and minimizes part count and mechanical complexity. Alternatively, the implementation could contain a separate motor 305 and/or drive screw 309 for each magnet.

In various embodiments, the example mechanisms described above—or other suitable mechanisms for moving and/or adjusting the relative position of the magnets 306A, B—can be activated by a number of ways. For example, the annular motor 305 which controls the drive screw 309 and which is controlled by the electronics 303 in the upper chassis 302A can be activated when the tool is at a surface location. Alternatively, the annular motor 305 can be activated while the tool is downhole, such as through commands sent via telemetry or other communication means. In this way, the relative positions of the magnets 306A, B can be adjusted dynamically (i.e., while the tool is downhole), thereby allowing the depth of investigation for the tool to change downhole. Additionally, in certain embodiments, spacing between magnets 306A, B might be changed from a feedback mechanism based on a caliper measurement of borehole size. By changing based on the borehole size, the depth of investigation can be optimized for a given borehole size, thereby improving signal-to-noise ratio during sections of the log while avoiding or reducing washouts. Accordingly, in example embodiments, the tool can provide NMR measurements at a plurality of depths of investigation while downhole. Other mechanics or arrangements for moving the magnets 306A, B are also possible. For example, hydraulic, pneumatic and/or electronic cranks, pulleys, pistons, gears, and the like could be used.

Figure 4:
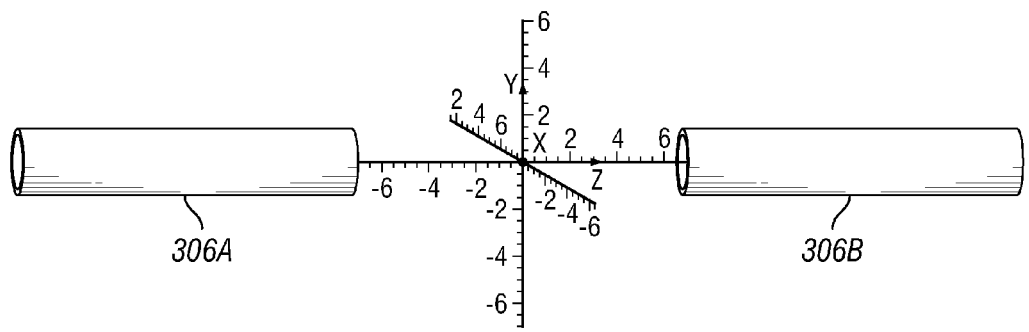
FIG. 4 is a diagram of two magnets reproduced on a set of axes, according to an example embodiment.

As discussed in more detail below, the spacing between magnets 306A, B can affect the strength, size, and gradient of a magnetic field generated. FIG. 4 is a diagram of two magnets 306A, B reproduced on a set of axes, according to an example embodiment. In the illustrated embodiment, the cylinders represent two permanent magnets 306A, B with their similar magnetic poles facing each other. This type of magnet assembly is often used in LWD NMR tools.

Figure 5:
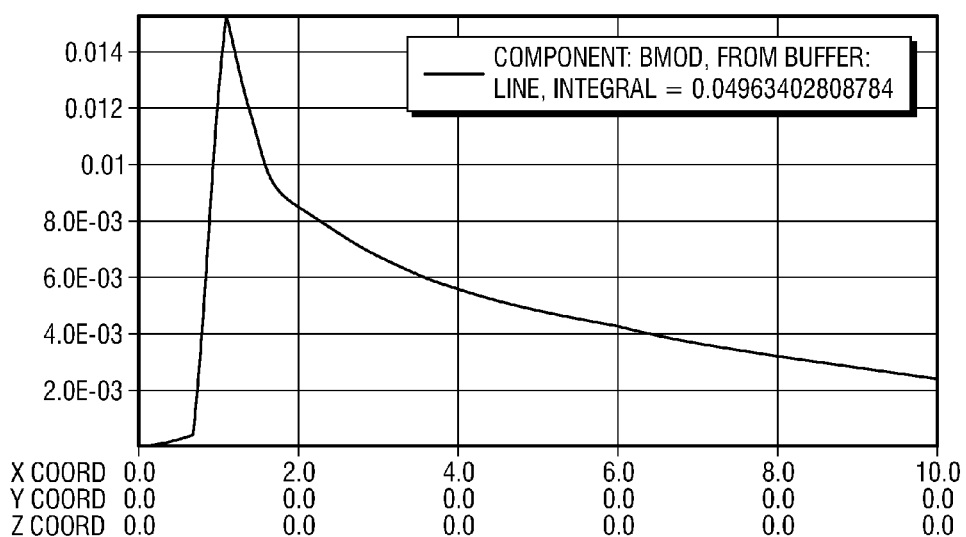
FIG. 5 is a chart illustrating the field profile along the radial direction of the magnet assembly of FIG. 4, according to an example embodiment.

For a magnet assembly similar to the one shown in FIG. 4, the field and field gradient can change as a function of magnet spacing. These changes can be seen in FIGS. 5-6. FIG. 5 is a chart illustrating the field profile along the radial direction of the magnet assembly of FIG. 4, according to an example embodiment. FIG. 5 illustrates Bo along radial direction from the center of the mandrel. This can be called a gradient field design. This line is from the center of the space between to the two magnets 306A, B, extending out orthogonal to the long axis of the magnets 306A, B. The center of the magnets 306A, B in the logging device is at x=0". In the illustrated embodiment, the field increases to a maximum at a point located at 1" from the center line of the tool and then decreases as a function of distance from the logging device.

Each depth of investigation has a particular resonance frequency and this frequency decays as one moves away from the center of the magnet system. There are multiple types of magnetic field configurations that can be created. One example type is a gradient field design, an example of which is shown in FIG. 4, as the design has a decaying field outside of the tool. Another example configuration is a saddle point type. In some embodiments, a saddle point field configuration can be defined by having a maximum field strength at a point outside of the tool containing the magnets 306A, B, which and then decays at farther or shorter distance from the tool center. Regardless of the particular configuration, the rate of decay at each point is called the magnetic field gradient.

The magnetic field gradient is a concept used in several applications of downhole NMR. For example, the gradient can be used to obtain molecular diffusion measurements (which can be used, for example, for fluid typing) and it is also related to the maximum excitable shell thickness and subsequent motion effects. In LWD NMR particularly, there can be significant lateral motion of the tool during drilling process. This movement can move the NMR receiving slice (the spatial region that contributes to NMR signal reception) out of the NMR excitation slice (the spatial region that the RF pulses excite NMR spin dynamics and generating the NMR signal). When the receiving and excitation slices move relative to each during the time of excitation and reception, the NMR signal may exhibit decay due to such motion. For a particular magnitude of the movement, the amount of corresponding decay is proportional to the overlap of the reception slice and the excitation slice. Thus the decay will be small when the slice area is much larger than the amount of the movement. The size of the receiving slice compared to the excited slice is fundamentally important in motion considerations. Accordingly, in some uses and some embodiments, it can be desirable to have a large excitation and reception slice compared to the expected tool motion.

A low gradient can decrease the sensitivity to motion. As an example, if an excitation field of 1 G is used at a given DOI, and the gradient is 1 G/cm, then a 1 cm thick shell is excited. If the gradient is 10 G/cm, then a 0.1 cm thick shell is excited.

Diffusion editing is a technique used to differentiate fluids with the same T2 or T1 values. Different hydrocarbon chain lengths generally diffuse at different rates. This measurement can be accomplished by using a magnetic field gradient to increase the attenuation of the signal by diffusion effects. By applying a T90-T180 pulse sequence before a CPMG, the time that the spins have to diffuse can be varied. In addition to this initial echo time (Te), the diffusion can be strongly influenced by the gradient strength. The larger the gradient, the larger the diffusion effect generally is, in some embodiments. By changing the initial echo encoding times, a D-T2 or D-T1 map (T1 or T2 are from the CPMG data after the diffusion encoding step, and D represents diffusion) can be created. The loss of signal from diffusion scales are $te^3$ and $G^2$ (where G is the gradient). Thus, the larger the gradient, the shorter the encoding time needs to be. This results in a more robust measurement to motion effects.

For a LWD porosity measurement it can be beneficial to have a low gradient so as to increase the sensitive region. However, when trying to perform a diffusion editing measurement, a higher gradient can be beneficial, as it would generally enable the reduction of measurement times. Thus, an example system that can be changed to move from being a low to high gradient dependent on the measurement objective can be very beneficial to a downhole NMR logging tool. Accordingly, a change in the spacing between the magnets 306A, B generally causes both the magnetic field and the magnetic field gradients to change at a given depth of investigation (DOI).

Figure 6:
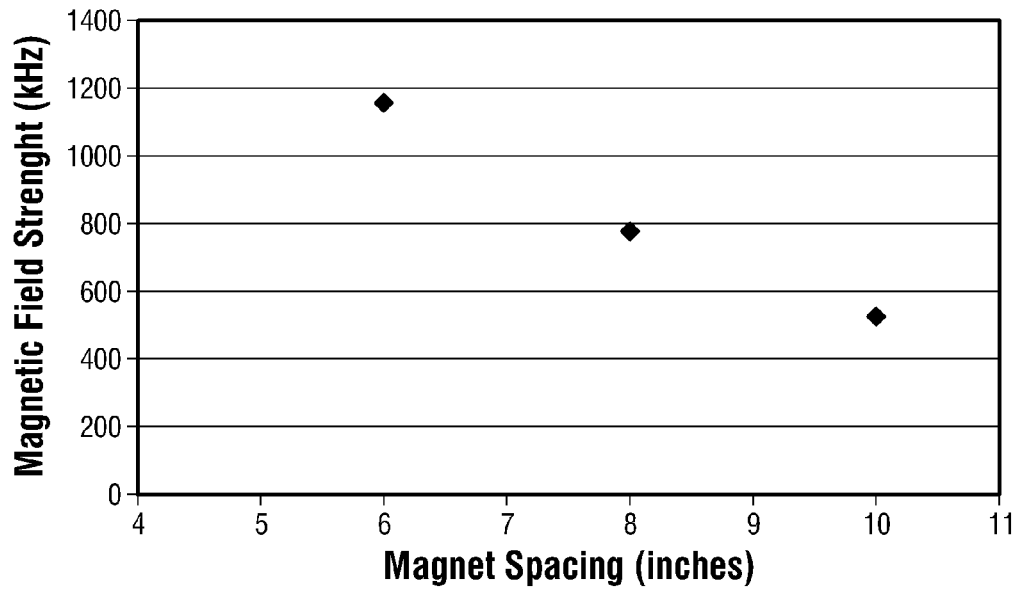
FIG. 6 is a chart illustrating an effect of magnet spacing on the magnetic field strength, according to an example embodiment.
Figure 7:
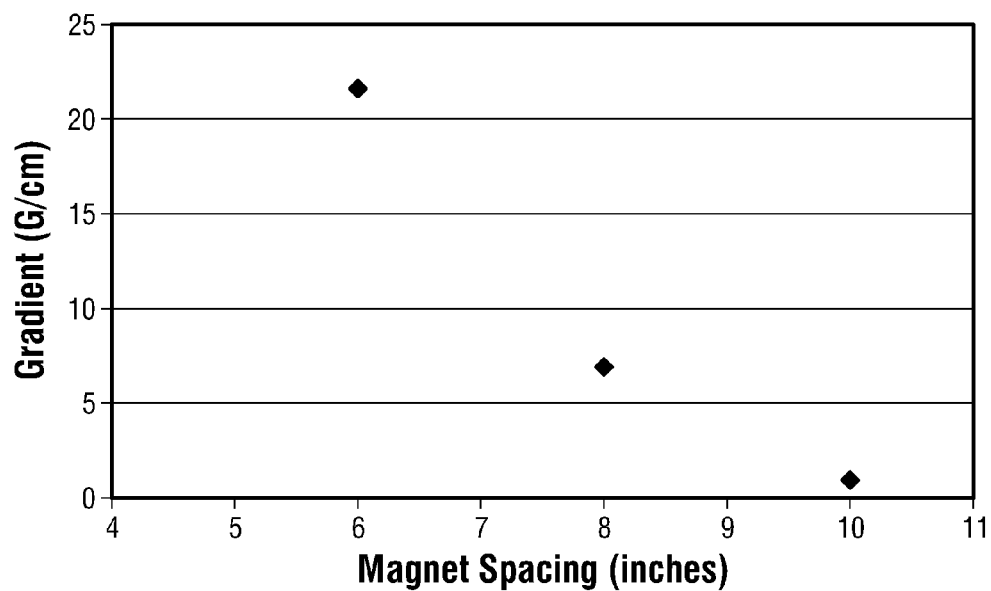
FIG. 7 is a chart illustrating the effect of magnet spacing on the magnetic field gradient, according to an example embodiment.

FIGS. 6 and 7, below, both show the effect of changing the spacing between the magnets 306A, B on the magnetic field and the gradient. FIG. 6 is a chart illustrating an effect of magnet spacing on the magnetic field strength, according to an example embodiment. For the values shown in FIG. 6, the field strength is calculated at a depth of 7" from the tool center, although the principles and relationships shown in the chart are not limited to any particular depth. The magnet spacing is from the end of one magnet to the end of the other. FIG. 7 is a chart illustrating the effect of magnet spacing on the magnetic field gradient, according to an example embodiment. As with FIG. 6, the values for field strength are calculated at a depth of 7" from the tool center. As seen, the gradient can vary from ~1 G/cm to 22 G/cm by changing the magnet spacing from 10" to 6".

Figure 8:
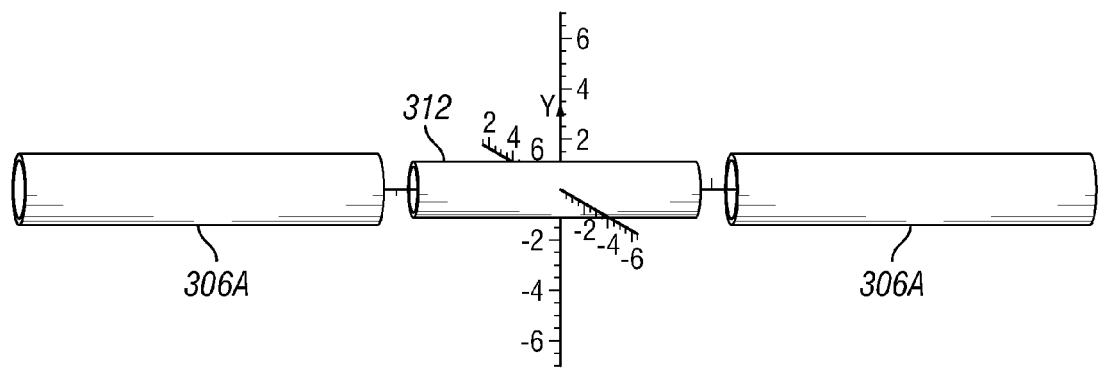
FIG. 8 illustrates a magnetically permeable member disposed between two magnets, according to an example embodiment.

FIG. 8 illustrates a magnetically permeable member 312 disposed between two magnets 306A, 306B, according to an example embodiment. The embodiment of FIG. 8 is one example of a method to increase the magnetic field strength at the depth of investigation—i.e., to insert a magnetically permeable member 312 with high permeability (such as 50) between the two permanent magnets 306A, 306B. In an example embodiment, this permeable member 312 guides the magnetic flux from the magnets 306A, 306B into the element piece and then pushes the magnetic field out radially around the center of the element, thus increasing the magnetic field. At the same time, the magnetically permeable member 312 increases the magnetic field gradient. In example embodiments, such as in FIG. 8, the permeable member 312 can be a solid permeable mandrel disposed axially between the two magnets 306A, 306B.

Figure 9A:
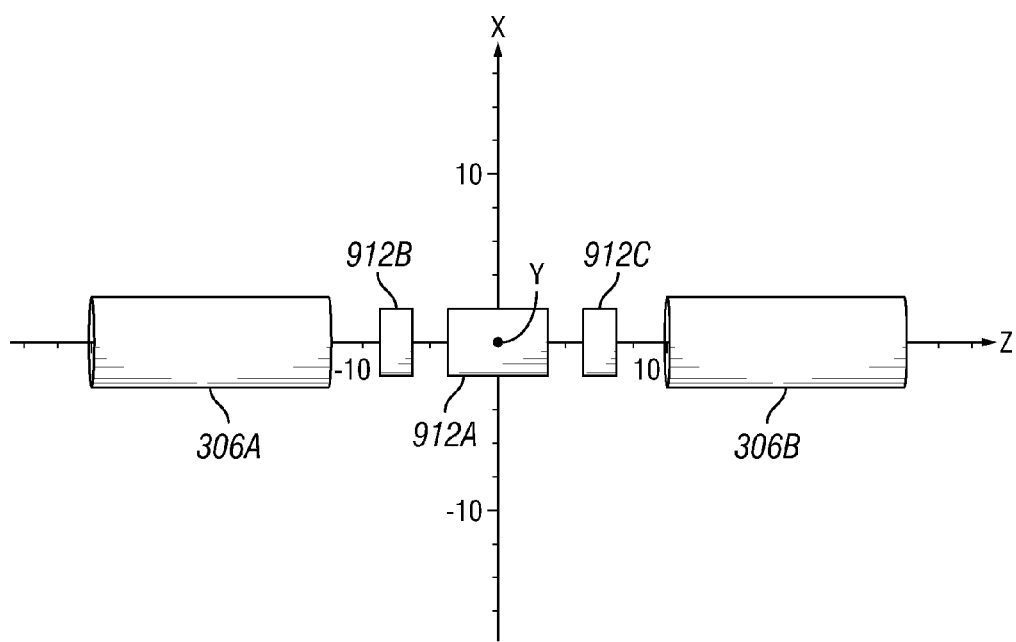
FIG. 9A illustrates a magnetically permeable member split into rings disposed between two magnets, according to an example embodiment.
Figure 9B:
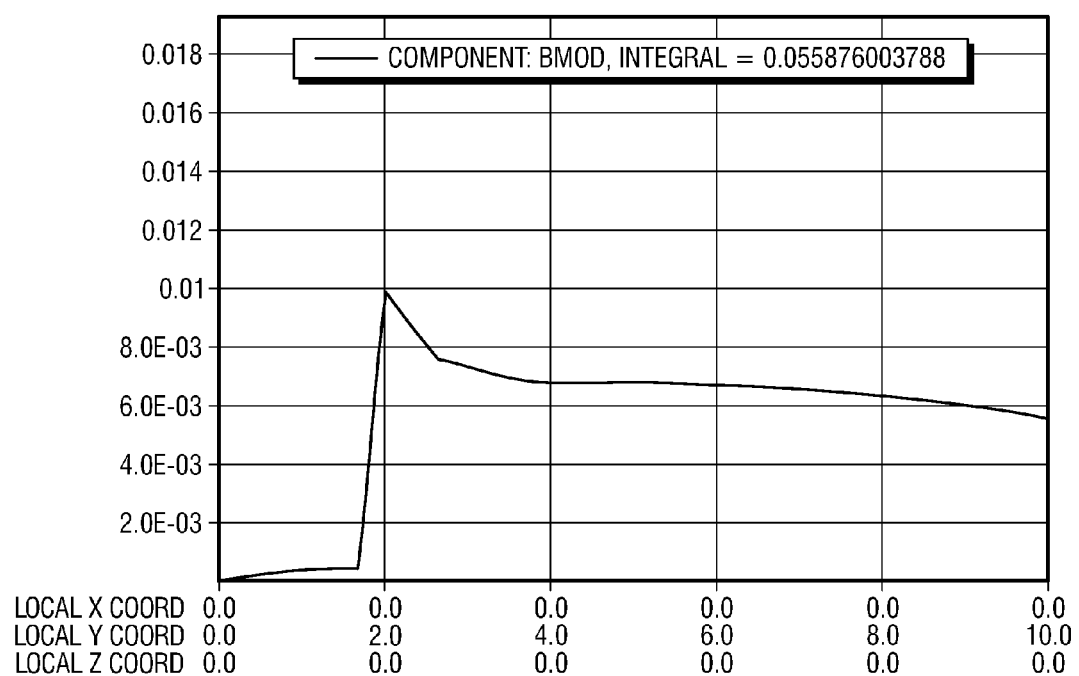
FIG. 9B is a chart illustrating the magnetic field profile along the radial direction of the magnet assembly of FIG. 9A, according to an example embodiment.
Figure 10:
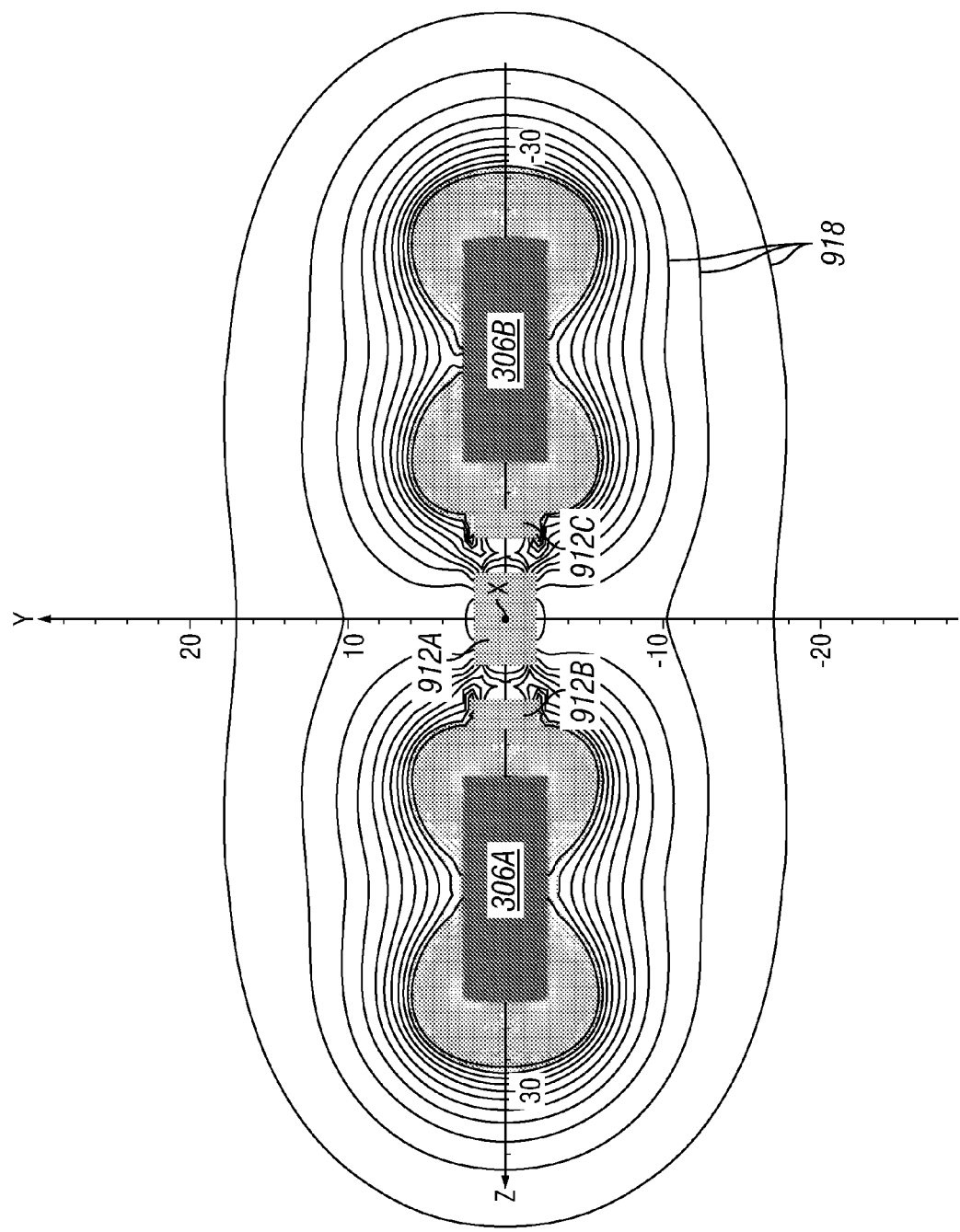
FIG. 10 is a chart illustrating magnetic isopotential lines of the magnet assembly of FIG. 9A, according to an example embodiment.

FIG. 9A illustrates a magnetically permeable member 312 split into rings 912A-C disposed between two magnets 306A, 306B, according to an example embodiment. As shown in FIG. 9A, the magnetically permeable member 312 is split into three rings 912A-C, with the middle ring 912A being longer than the outer two rings 912B, 912C of equal side. In various embodiments, a variety of other arrangement are possible (e.g., split into any number of rings 912, the rings 912 having a variety of sizes or uniform sizes, etc.) This permeable member 312 can be further split up into smaller rings 912 in order to change the magnetic field profile. These rings 912A-C can also be moved axially, and doing so can further change the magnetic field configuration (e.g. magnetic field strength and field gradients). By changing the distribution of the magnetic material, the magnetic field and the magnetic field gradient are changed, as the magnetic field and gradient depend at least partially upon the distribution of magnetic material FIG. 9B is a chart illustrating the magnetic field profile along the radial direction of the magnet assembly of FIG. 9A, according to an example embodiment. FIG. 10 is a chart illustrating magnetic isopotential lines 918 of the magnet assembly of FIG. 9A, according to an example embodiment.

Figure 11A:
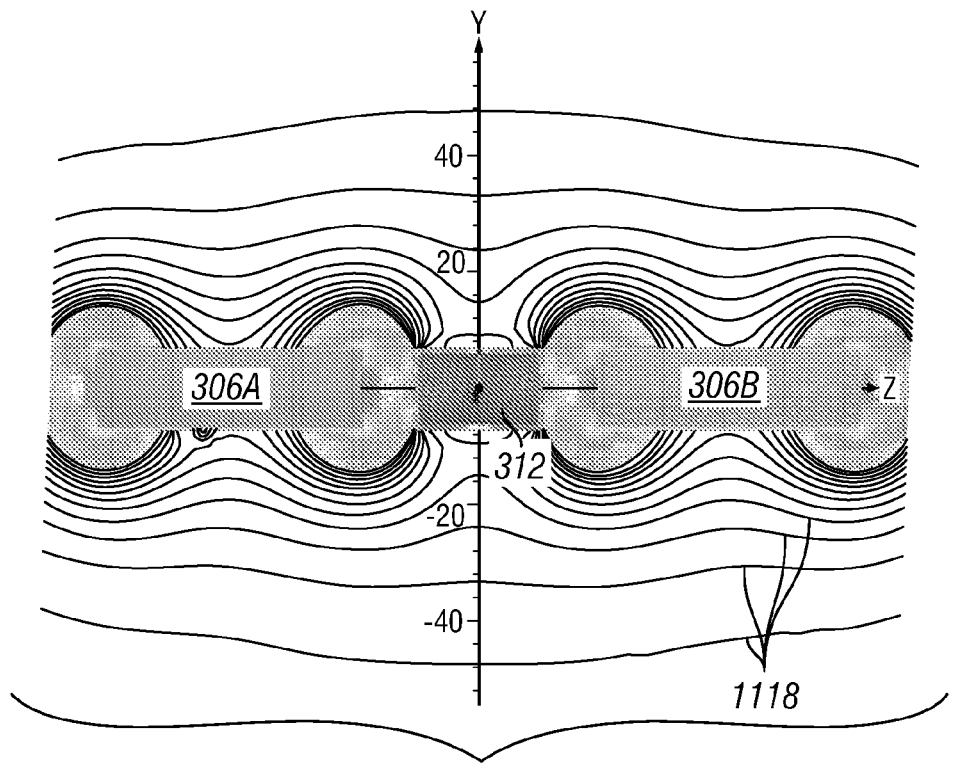
FIG. 11A is a chart illustrating magnetic isopotential lines of an illustrated magnet assembly with a permeable member, according to an example embodiment.
Figure 11B:
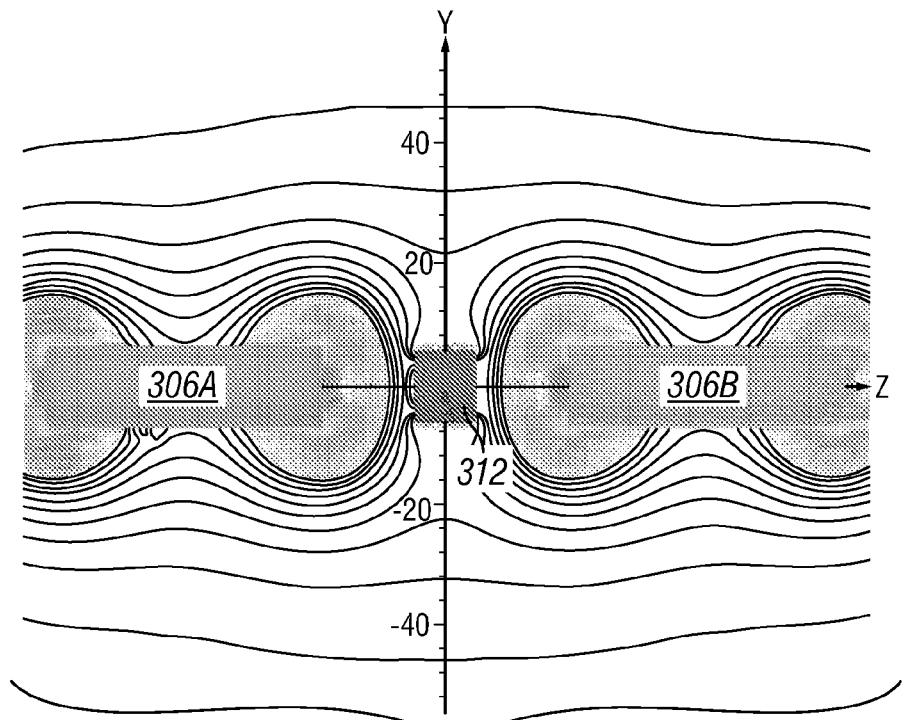
FIG. 11B is a chart illustrating magnetic isopotential lines of another illustrated magnet assembly with a permeable member shorter than that of FIG. 11A.
Figure 11C:
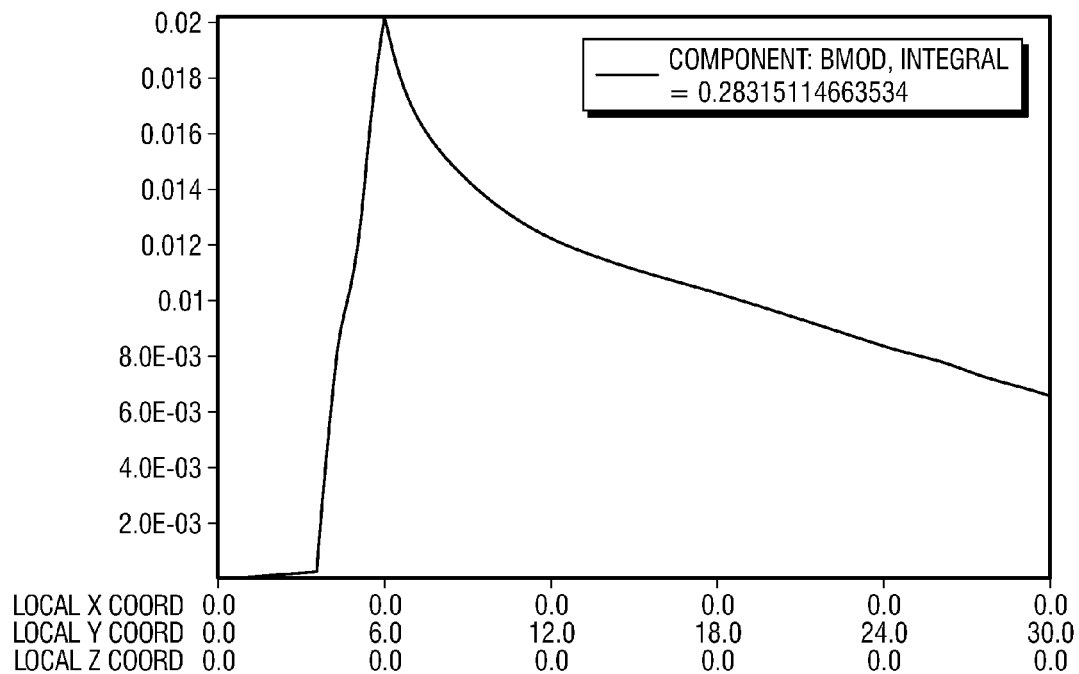
FIG. 11C is a chart illustrating the magnetic field profile of the magnet assembly shown in FIG. 11A.
Figure 11D:
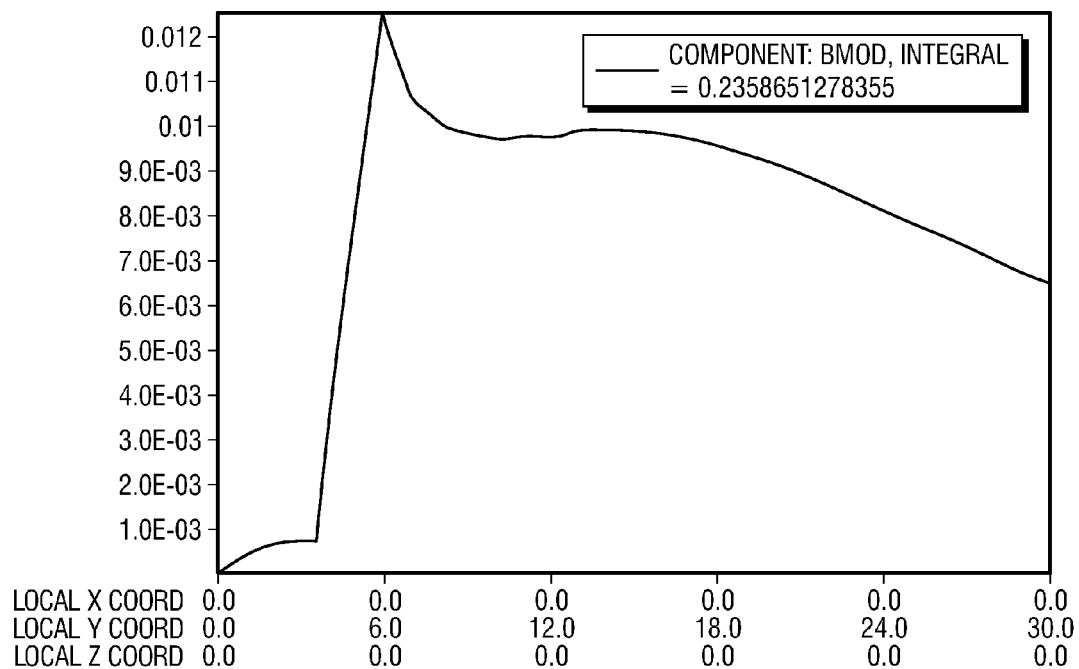
FIG. 11D is a chart illustrating the magnetic field profile of the magnet assembly shown in FIG. 11B.

FIGS. 11A-D illustrate other examples of the effect of changing the size of the permeable member 312 on the magnetic field. FIG. 11A is a chart illustrating magnetic isopotential lines 1118 of an illustrated magnet assembly with a permeable member 312, according to an example embodiment. FIG. 11B is a chart illustrating magnetic isopotential 1118 lines of another illustrated magnet assembly with a permeable member 312 shorter than that of FIG. 11A. FIGS. 11A and 11B are based on a magnet spacing of 40 cm, with FIG. 11A being based on a SW of 20 cm and FIG. 11B being based on an SW of 20 cm. FIG. 11C is a chart illustrating the magnetic field profile of the magnet assembly shown in FIG. 11A. FIG. 11D is a chart illustrating the magnetic field profile of the magnet assembly shown in FIG. 11B.

By examining FIGS. 11A-D, it can be seen that if the permeable members 312 are decreased in size with a fixed magnet spacing, the field profile and gradient change. There is a point at which the design moves from being a gradient tool into being a saddle point design. In example embodiments, to change the permeable members 312 that sit between the two magnets 306A, 306B, magnetic and non-magnetic pieces can be welded together to create an insert to the flow line 310. This piece can be interchangeable with other similar pieces that are configured to produce a desired magnetic field and magnetic field gradient.

In example embodiments, the spacing between the permeable rings 312A-C or other pieces that are disposed between the magnets 306A, B can be changed by a variety of mechanisms. In one embodiment, non-magnetic sliding rings between permeable rings 312A-C can be used. These sliding rings can expand or contract, thus moving the permeable rings 312A-C in and out with respect to the center of the magnet assembly system.

In example embodiments, a mechanical implementation similar to those example implementations described above with reference to FIG. 3 can be used for the sliding the permeable rings 312A-C. Also, the annular motor 305 can be at either end of the system. Combined with this, or separately, the magnet spacing can be varied. In the case with a combined split mandrel design, the variation in the magnet spacing changes both the Bo maximum and the field gradient at a particular depth of investigation.

In some embodiments, if the magnet spacing is changed at the same time as the rings are moved, then the same magnetic field strength with a higher or lower gradient can be created.

By having the ability to move both magnets 306A, B and permeable members 312, the magnetic field strength and gradient can be more tailored.

Figure 12A:
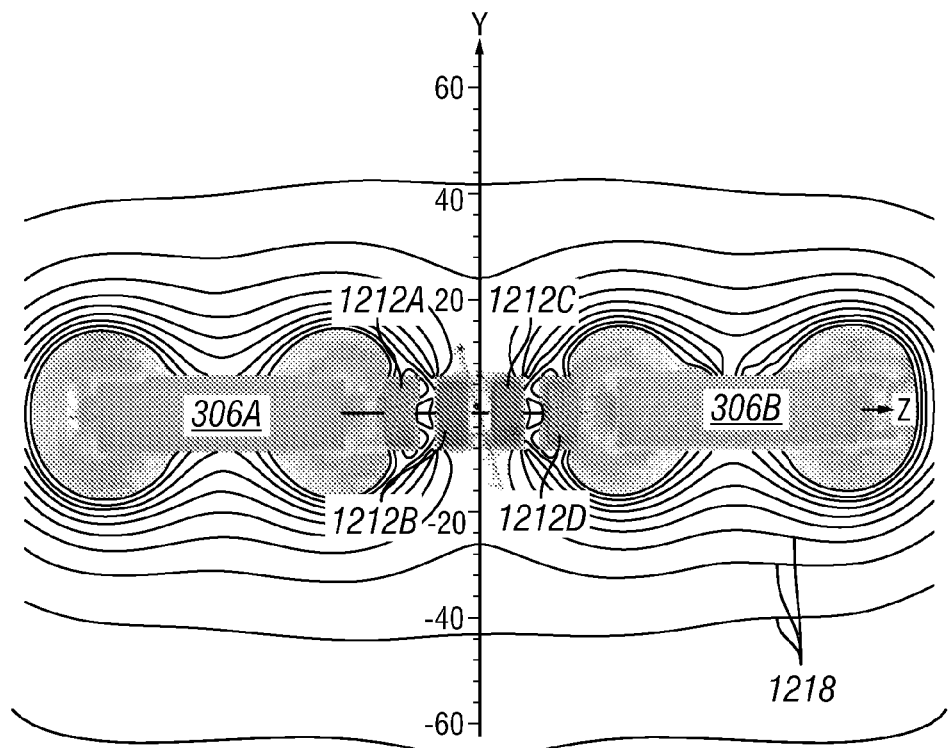
FIG. 12A is a chart illustrating magnetic isopotential lines of an illustrated magnet assembly with a multiple permeable rings, according to an example embodiment.
Figure 12B:
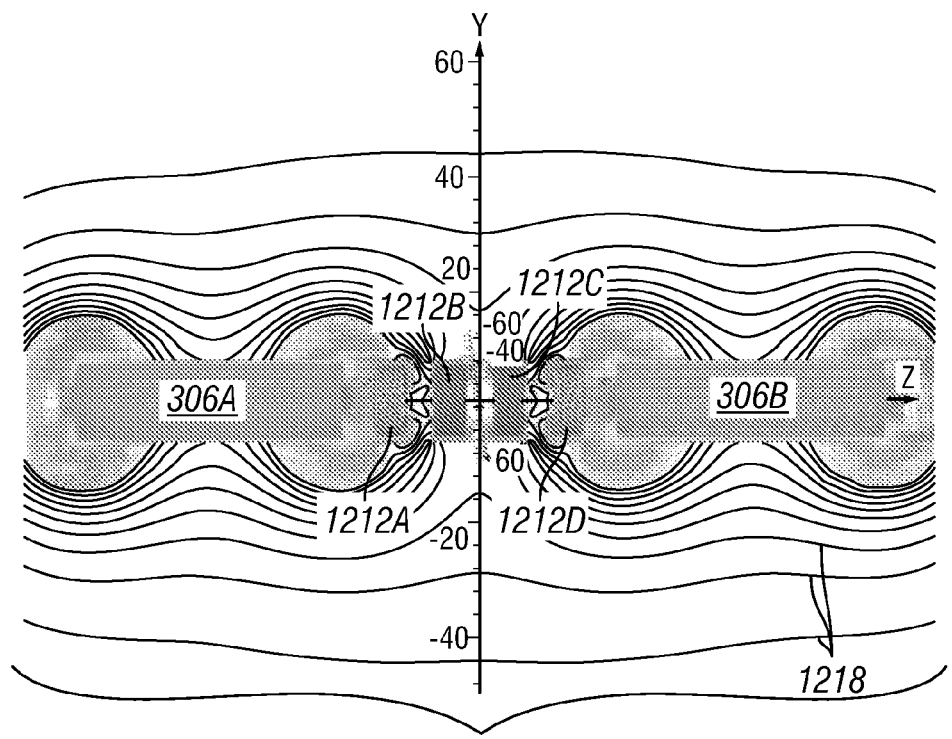
FIG. 12B is a chart illustrating magnetic isopotential lines of another illustrated magnet assembly with a permeable member and a shorter magnet spacing than that of FIG. 12A.
Figure 12C:
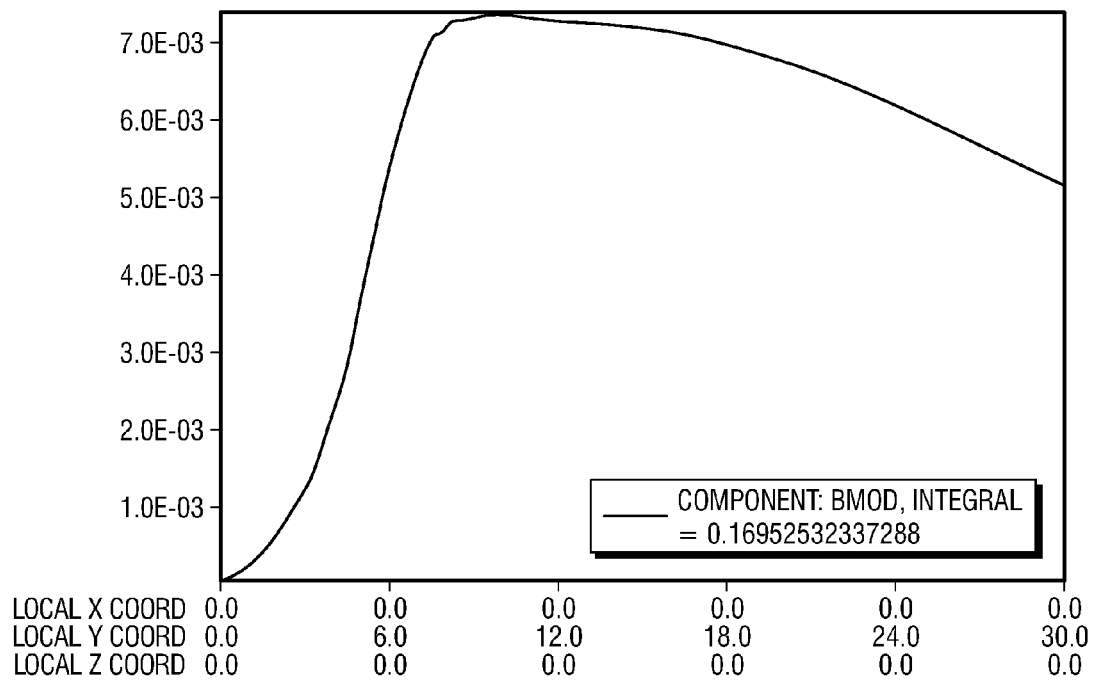
FIG. 12C is a chart illustrating the magnetic field profile of the magnet assembly shown in FIG. 12A.
Figure 12D:
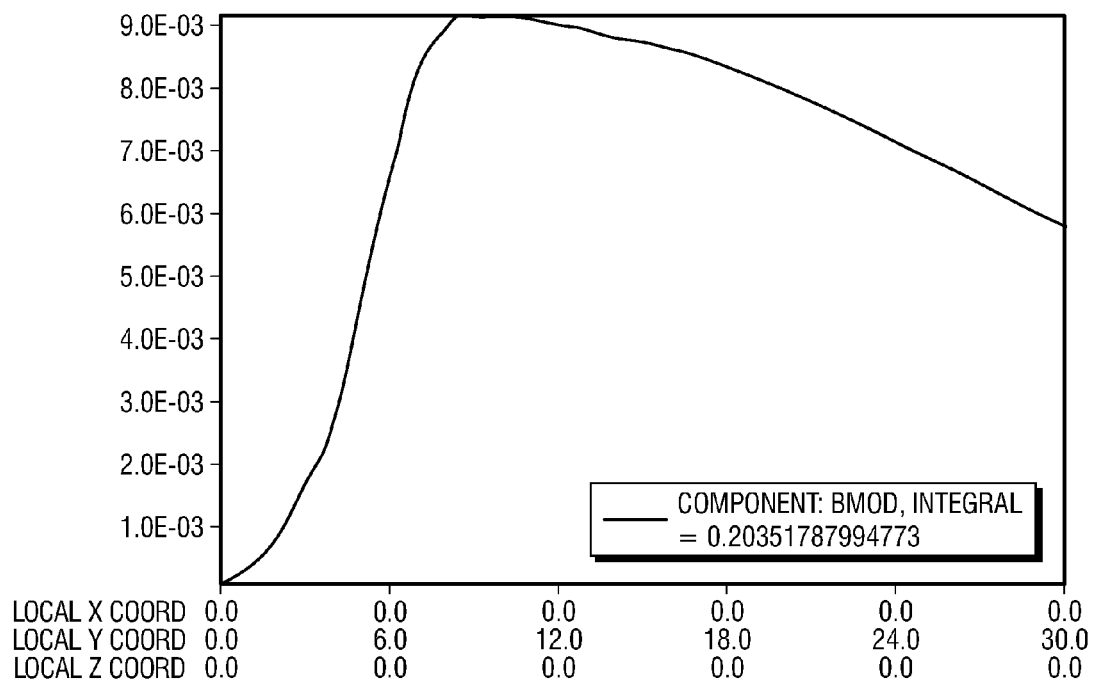
FIG. 12D is a chart illustrating the magnetic field profile of the magnet assembly shown in FIG. 12B.

FIGS. 12A-D illustrate other examples of the effect of changing the magnet spacing with permeable rings 1212A-D on the magnetic field gradient. Changing the magnet spacing can drop the field and the gradient lower. FIG. 12A is a chart illustrating magnetic isopotential lines 1218 of an illustrated magnet assembly with a multiple permeable rings 1212A-D, according to an example embodiment. FIG. 12B is a chart illustrating magnetic isopotential lines 1218 of another illustrated magnet assembly with a permeable member 312 and a shorter magnet spacing than that of FIG. 12A. FIGS. 12A and 12B are based on an SW of 20 cm and a cutout of 3×5 cm, with FIG. 12A being based on a magnet spacing of 50 cm, and FIG. 12B being based on a magnet spacing of 46 cm. FIG. 12C is a chart illustrating the magnetic field profile of the magnet assembly shown in FIG. 12A. FIG. 12D is a chart illustrating the magnetic field profile of the magnet assembly shown in FIG. 12B.

Although specific embodiments of the invention have been described above in detail, the description is merely for purposes of illustration. Various modifications of, and equivalent steps corresponding to, the disclosed aspects of the exemplary embodiments, in addition to those described above, can be made by those skilled in the art without departing from the spirit and scope of the invention defined in the following claims, the scope of which is to be accorded the broadest interpretation so as to encompass such modifications and equivalent structures.

What is claimed is:

1. A nuclear magnetic resonance apparatus comprising:
    a first magnet;
    a second magnet having a spacing from the first magnet; and
    a moving assembly for controlling the spacing, wherein the moving assembly comprises a screw connecting to a first section having right hand threads and a second section having left hand threads.

2. The apparatus of claim 1,
    wherein the first magnet interfaces with the first section and the second magnet interfaces with the second section.

3. The apparatus of claim 2, further comprising a motor to rotate the screw.

4. The apparatus of claim 2, further comprising a motor to rotate the screw, the motor being in communication with a surface location.

5. The apparatus of claim 4, further comprising an antenna and a plurality of rings comprising a magnetically permeable material, the antenna and the plurality of rings being disposed between the first magnet and second magnet,
    wherein the plurality of rings affect a strength and a gradient of a magnetic field generated by the first magnet and the second magnet.

6. The apparatus of claim 1, further comprising an antenna disposed between the first magnet and second magnet.

7. The apparatus of claim 1, further comprising a plurality of rings disposed between the first magnet and the second magnet, the plurality of rings comprising a magnetically permeable material.

8. A nuclear magnetic resonance apparatus comprising:
    a first magnet;
    a second magnet having a spacing from the first magnet;
    a moving assembly for controlling the spacing between the first and second magnets; and
    a magnetically permeable member disposed between the first magnet and the second magnet.

9. The apparatus of claim 8, wherein the magnetically permeable member affects a strength of a magnetic field generated by the first magnet and the second magnet.

10. The apparatus of claim 8, wherein the magnetically permeable member affects a gradient of a magnetic field generated by the first magnet and the second magnet.

11. A method for logging a formation, comprising the steps of:
    placing a nuclear magnetic resonance tool in a borehole in the formation, the nuclear magnetic resonance tool comprising a first magnet movable with respect to a second magnet, the first magnet and the second magnet being separated by a first spacing;
    obtaining a first nuclear magnetic resonance measurement from the nuclear magnetic resonance tool while the first magnet and second magnet are separated by the first spacing;
    adjusting a spacing between the first magnet and the second magnet such that the first magnet and second magnet are separated by a second spacing, wherein adjusting the spacing between the first magnet and the second magnet comprises the step of actuating a motor to rotate a screw interfacing with at least one of the first magnet and the second magnet, wherein actuating the motor comprises transmitting an instruction from a surface location to actuate the motor; and
    obtaining a second nuclear magnetic resonance measurement from the nuclear magnetic resonance tool while the first magnet and second magnet are separated by the second spacing.

12. The method of claim 11, further comprising changing a magnetic field strength by inserting a magnetically permeable member axially between the first magnet and the second magnet.

13. The method of claim 11, wherein the first magnet and the second magnet generate a magnetic field having a magnetic field strength, and
    wherein adjusting the spacing between the first magnet and the second magnet affects the magnetic field strength.

14. The method of claim 11, further comprising increasing a magnetic field strength of the first magnet and the second magnet by decreasing a spacing between the first magnet and the second magnet.

15. The method of claim 11, further comprising increasing a magnetic field gradient of the first magnet and the second magnet by decreasing a spacing between the first magnet and the second magnet.

* * * * *